United States Patent
Powell et al.

(10) Patent No.: US 7,598,880 B2
(45) Date of Patent: Oct. 6, 2009

(54) WIRELESS BATTERY MONITORING SYSTEM AND METHOD

(75) Inventors: Jeffrey M. Powell, Lewis Center, OH (US); Daniel M. Chrystal, Marengo, OH (US); David G. Saliaris, Lewis Center, OH (US)

(73) Assignee: Liebert Corporation, Columbus, OH (US)

(*) Notice: Subject to any disclaimer, the term of this patent is extended or adjusted under 35 U.S.C. 154(b) by 315 days.

(21) Appl. No.: 11/308,224

(22) Filed: Mar. 13, 2006

(65) Prior Publication Data
US 2006/0250233 A1 Nov. 9, 2006

Related U.S. Application Data

(60) Provisional application No. 60/594,133, filed on Mar. 14, 2005.

(51) Int. Cl.
G08B 21/00 (2006.01)
(52) U.S. Cl. ............... 340/636.1; 340/635; 340/636.12
(58) Field of Classification Search .............. 340/636.1; 320/106; 324/426; 702/63
See application file for complete search history.

(56) References Cited

U.S. PATENT DOCUMENTS

| | | | | |
|---|---|---|---|---|
| 5,929,764 A * | 7/1999 | Brink et al. | ............... | 340/636.1 |
| 5,955,865 A * | 9/1999 | Koike et al. | ................. | 320/104 |
| 6,028,933 A * | 2/2000 | Heer et al. | ................... | 713/169 |
| 6,084,523 A * | 7/2000 | Gelnovatch et al. | ...... | 340/636.1 |
| 6,094,031 A | 7/2000 | Shimane et al. | | |
| 6,701,094 B1 * | 3/2004 | Radomsky et al. | .......... | 398/182 |
| 6,879,849 B2 * | 4/2005 | Begic | ....................... | 455/575.7 |
| 7,053,765 B1 * | 5/2006 | Clark | ......................... | 340/506 |
| 2002/0008621 A1 * | 1/2002 | Barritz et al. | ............ | 340/572.1 |
| 2002/0187372 A1 * | 12/2002 | Hall et al. | ...................... | 429/7 |
| 2003/0097302 A1 * | 5/2003 | Overhultz et al. | ............. | 705/14 |
| 2003/0214267 A1 | 11/2003 | Long | | |
| 2005/0009577 A1 | 1/2005 | Kangas et al. | | |
| 2005/0038614 A1 * | 2/2005 | Botts et al. | .................... | 702/63 |
| 2005/0040944 A1 * | 2/2005 | Contestabile | .......... | 340/539.13 |
| 2005/0162172 A1 * | 7/2005 | Bertness | ..................... | 324/426 |
| 2005/0237213 A1 * | 10/2005 | Teller | ...................... | 340/686.1 |
| 2006/0046104 A1 * | 3/2006 | Zimmerman | ................... | 429/7 |

FOREIGN PATENT DOCUMENTS

| | | |
|---|---|---|
| GB | 2416215 | 1/2006 |
| WO | 9932323 A1 | 7/1999 |
| WO | 03047064 A3 | 6/2003 |
| WO | 2004073001 | 8/2004 |

OTHER PUBLICATIONS

United Kingdom Search and Examination Report for corresponding United Kingdom Patent Application No. 0605012.4.

* cited by examiner

*Primary Examiner*—Toan N Pham
*Assistant Examiner*—Kerri McNally
(74) *Attorney, Agent, or Firm*—Locke Lord Bissell & Liddell LLP

(57) ABSTRACT

A wireless battery monitoring system and method include a receiver and a plurality of wireless transmitters. The transmitters are connectable to a corresponding battery and are encoded to identify the corresponding battery. The transmitters are programmed to transmit data regarding the corresponding battery, such as voltage, temperature, balancer activity, etc., to the receiver.

18 Claims, 3 Drawing Sheets

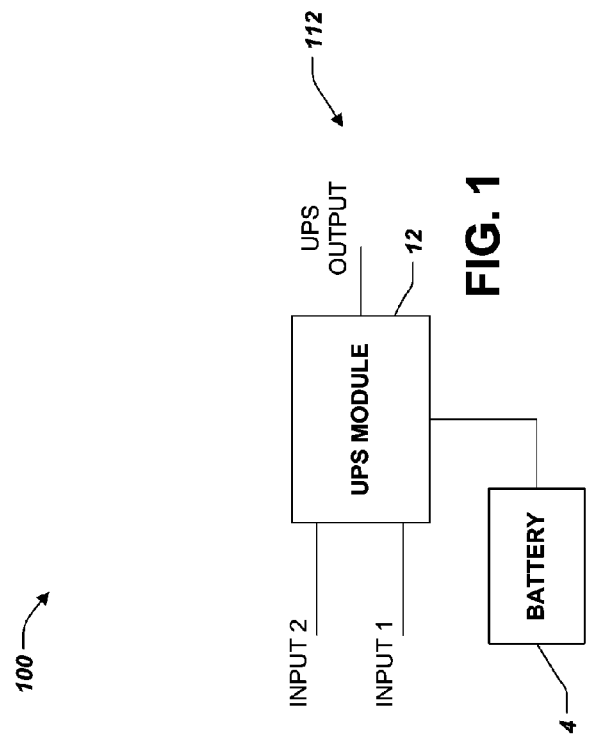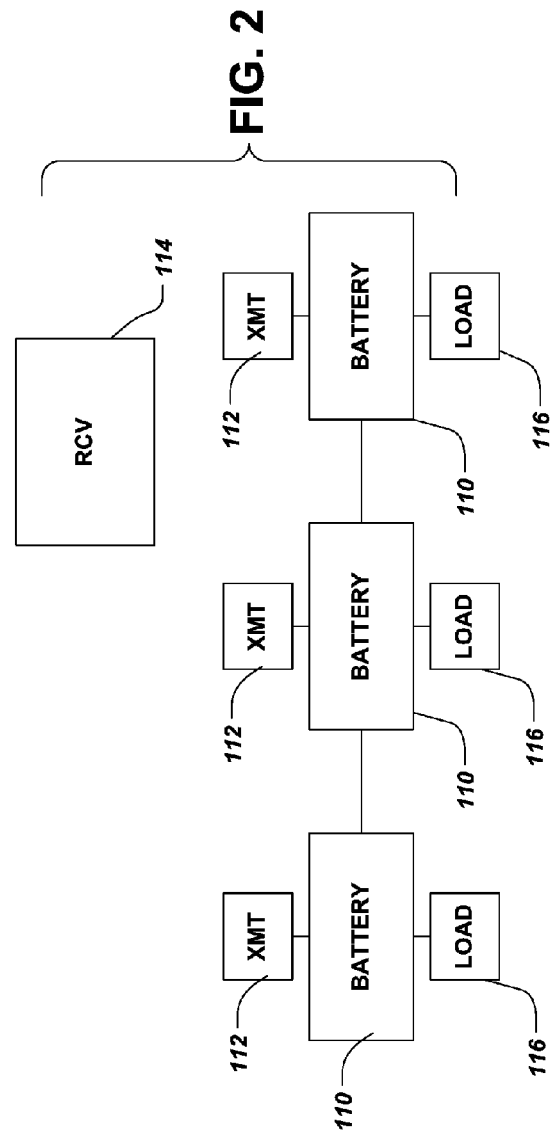

US 7,598,880 B2

WIRELESS BATTERY MONITORING SYSTEM AND METHOD

BACKGROUND

The present invention relates generally to battery monitoring systems such as battery modules used with uninterruptible power supply (UPS) systems.

To provide continuous power to a load in applications that require continuity of power, such as in hospitals and critical processes in both industrial and commercial settings, a UPS system is typically used to switch between a primary and one or more alternate power sources in the event of failure or instability of the primary source. FIG. 1 illustrates portions of a typical UPS system 10. One or more input power lines are connected to a UPS module 12, and a battery module 14 is connected to the UPS module. If the input power fails, the battery module 14 provides power to the UPS module 12. The battery back up power may be required when power from the AC power sources are performing outside of acceptable limits or fail completely.

Battery monitoring systems are often employed to monitor the battery modules and insure that viable back-up power exists. With some known battery monitoring systems, a wire is run from each battery measuring point to a single central voltage data collection point. For series strings of batteries, such a wiring arrangement can be problematic for a variety of reasons. For instance, high voltages are involved and there are potential safety agency issues. Small wires are difficult to protect and install in a heavy current environment, and the wiring may be vulnerable, and particularly prone to damage during field battery maintenance. Isolation is required at the collection point, making accurate differential measurements difficult.

Further, the wiring can be expensive, and factory installation typically exhibits high labor costs. Because of the wiring, after-market field installation costs can cost as much or more than the monitoring equipment itself. Prior to installation, wired battery monitor systems require a site survey. Multiple custom battery rack configurations make determining wiring needs difficult. Wired battery monitor systems require up-front knowledge of the battery room configuration to determine wire lengths, conduit runs, etc. Inaccurate site surveys can cause significant back charges for revisions.

Additionally, long strings of batteries will become charge-imbalanced over time, thus affecting reliability and autonomous battery operation time. Imbalanced battery strings also will exhibit a lessened life expectancy for some of the individual batteries.

The present application addresses shortcomings associated with the prior art.

SUMMARY

In accordance with aspects of certain teachings of the present disclosure, a wireless battery monitoring system and method are presented. The system includes a receiver and a plurality of wireless transmitters. The transmitters are connectable to a corresponding battery and are encoded to identify the corresponding battery. The transmitters are programmed to transmit data regarding the corresponding battery, such as voltage, temperature, balancer activity, etc., to the receiver.

In certain embodiments, the transmitters transmit the data at random time intervals. A plurality of load devices may further be connected across each of the corresponding batteries to provide balancing. The transmitted data may include a checksum to provide a means to verify the data received by the receiver.

BRIEF DESCRIPTION OF THE DRAWINGS

Other objects and advantages of the invention will become apparent upon reading the following detailed description and upon reference to the drawings in which:

FIG. 1 is a block diagram schematically illustrating portions of a typical UPS system.

FIG. 2 is a block diagram of an exemplary battery monitoring system in accordance with certain teachings of the present disclosure.

Figure 3:
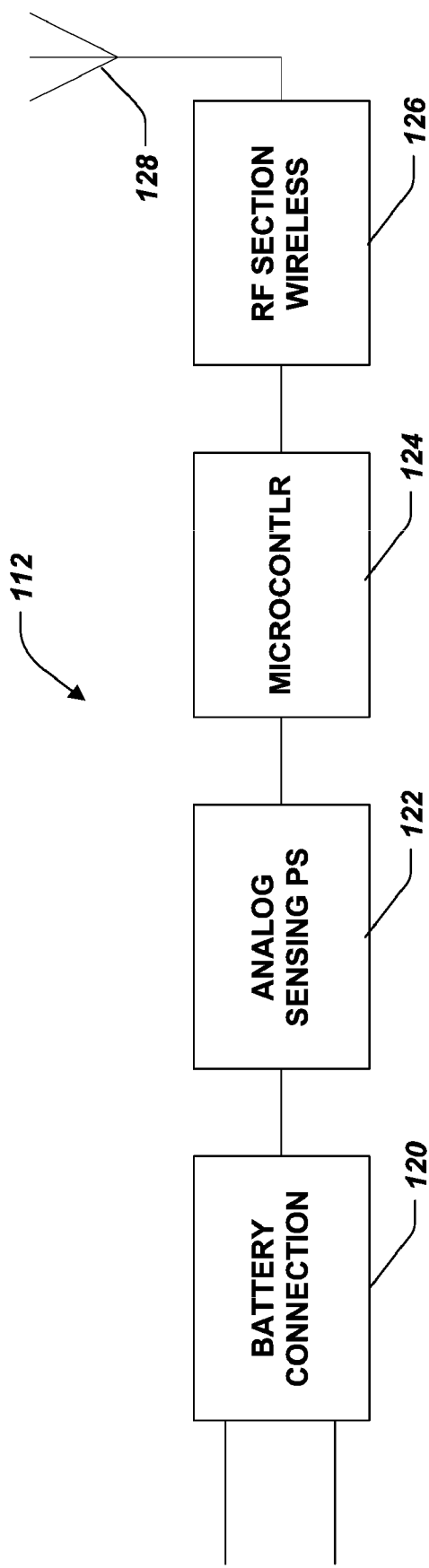
FIG. 3 is a block diagram of an exemplary wireless transmitter in accordance with certain teachings of the present disclosure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 2 is a block diagram of an exemplary battery monitoring system 100 in accordance with certain teachings of the present disclosure. The system 100 monitors a plurality of batteries 110. In other embodiments, each cell within a battery could be monitored, or a plurality of cells within a single battery, or a plurality of batteries within a cluster. Wireless transmitters 112 are connected to each of the batteries, and a receiver 114 receives bursts of data from the transmitters 112. The transmitters 112 send the data over a wireless medium such as RF to avoid the problems with wires discussed in the Background section hereof. FIG. 3 is a block diagram illustrating an exemplary wireless transmitter 112. The illustrated wireless transmitter 112 includes a battery connection 120, an analog sensing power supply section 122, a micro controller 124 and an RF section 126 connected to an antenna 128.

The transmitters 112 are connected directly across the corresponding battery 110, allowing the system to monitor operational power and battery voltage information, while providing the means to connect a small load 116 across the battery 110 to achieve balancing. The load 116 may be achieved by switching a resistor across the battery 110, or by conductively modulating a semiconductor connected across the battery 110. The load 110 is configured to draw a current within an order of magnitude of the normal battery leakage current. The system battery charger can readily supply the required balancing currents. This arrangement produces a minimal impact on overall system efficiency.

The transmitters 112 are encoded so that the battery string information is provided as well as the individual battery identifier in the string. Data relating to the battery voltage, temperature, and balancer activity, for example, is monitored. A checksum is further added to the data.

The transmitters 112 provide short, quick bursts over time. In exemplary embodiments, the bursts are sent at random time intervals. For instance, if a 10 second average reporting latency is used, the transmitters 112 can be programmed to send out a burst randomly within 5 to 15 seconds after the last burst. The randomness assures that the bursts from multiple transmitters will have little impact on the system when a collision occurs between two transmitter bursts. In the event of an occasional collision, the receiver will recognize it received bad data via a checksum error and simply discard the data.

The likelihood of a collision can be readily calculated. For instance, a suitable transmitter 112 is a mini-microcontroller with an on-chip RF transmitter, such as an Atmel AT86RF401. With such a transmitter device, the data rate is 10 k baud. Fewer than 100 bytes would be sufficient to encode a burst, so no more than 10 ms would be used out of 10 seconds, or 0.1% of the bandwidth is used per transmitter 112. For 40 batteries, 4% of the bandwidth would be needed, resulting in a collision occurring about every 2 minutes. The odds of two subsequent collisions for the same transmitter are quite small, and the odds of three subsequent collisions is so small as to be inconsequential, resulting in reliable data over a 30 second period. Optimum burst transmission rates can be determined for various applications. Speeding up the data burst rate results in more collisions, but reduces the overall latency in the process.

Figure 4:
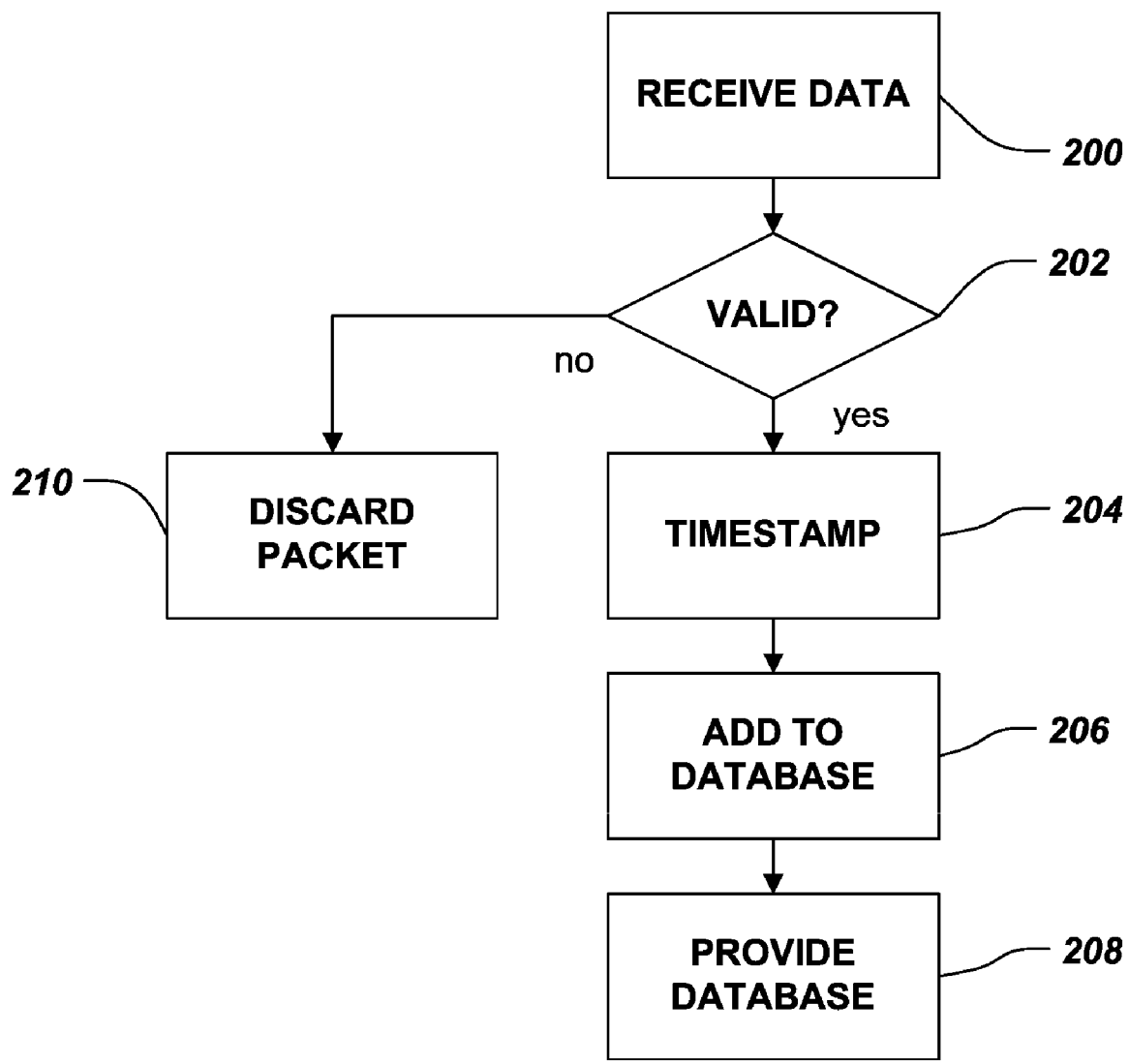
FIG. 4 is a flow chart illustrating an exemplary series of data-handling events executed by the system shown in FIG. 2.

FIG. 4 is a flow chart illustrating an exemplary series of data-handling events. Of course, these process steps could be varied as necessary based on the particular system arrangement. As a data packet is received in block 200, the receiver 114 checks the validity of the packet in decision block 202. If the packet is valid, the receiver 114 timestamps the data in block 204 and adds the data to the appropriate category in the database in block 206. In block 208, the receiver provides the database when requested by the system monitor. If the packet is invalid or otherwise corrupted due to a collision, the checksum will fail and it is discarded in block 210.

Generally, in applications such as described herein, two-way communications is not required. While two-way communications would prevent collisions and maximize transfer rates, it is wasteful if there is no need for real-time data. The balancing function of the transmitter 112 is performed in real time, but the transmitted data is not involved in real-time control.

To avoid additional wiring in the battery cabinet or battery area, the small transmitting antenna 128 is included within the housing enclosing the transmitter. The transmitter's microcontroller printed circuit board includes an etched pattern constituting a tuned loop antenna. Alternately a manufactured antenna could be used for increased gain, such as a surface mount chip antenna. Suitable antennas are available from gigaAnt (www.gigaant.com), for example.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A battery monitoring system, comprising:
   a receiver; and
   a plurality of wireless transmitters, each of the transmitters connectable to a corresponding battery, the transmitters being encoded to identify the corresponding battery, the transmitters being programmed to transmit data regarding the corresponding battery to the receiver, and the transmitters further being configured to connect a load across the corresponding battery, the load being a modulated semiconductor configured to draw a current within an order of magnitude of a normal battery leakage current.

2. The battery monitoring system of claim 1, wherein the transmitters transmit the data at random time intervals.

3. The battery monitoring system of claim 1, further comprising a plurality of load devices, each of the load devices being connected across a corresponding battery.

4. The battery monitoring system of claim 1, wherein the transmitted data includes a checksum.

5. The battery monitoring system of claim 1, wherein the receiver checks the validity of data as the data are received.

6. The battery monitoring system of claim 1, wherein the transmitter includes an antenna, the transmitter and antenna being situated within a single housing.

7. The battery monitoring system of claim 6, wherein the antenna comprises an etched pattern on a printed circuit board.

8. The battery monitoring system of claim 1, wherein the data is transmitted in a burst of less than 100 bytes.

9. The battery monitoring system of claim 1, wherein the data is transmitted in less than 10 ms.

10. A method of monitoring a plurality of batteries; comprising:
    connecting a wireless transmitter across a corresponding one of the plurality of batteries such that each of the batteries has a corresponding transmitter connected thereto, the transmitters being configured to connect a load across the corresponding battery, the load being a modulated semiconductor configured to draw a current within an order of magnitude of a normal battery leakage current;
    encoding each of the transmitters to identify the corresponding battery; and
    transmitting data from the transmitters regarding the corresponding battery to a receiver.

11. The method of claim 10, wherein the data are transmitted at random time intervals.

12. The method of claim 10, further comprising connecting a load device across a corresponding one of the batteries to provide balancing.

13. The method of claim 10, wherein the transmitted data includes a checksum.

14. The method of claim 10, further comprising checking the validity of data as the data are received.

15. The method of claim 10, wherein the data is transmitted in a burst of less than 100 bytes.

16. The method of claim 10, wherein the data is transmitted in less than 10 ms.

17. A method of monitoring a plurality of batteries; comprising:
    connecting a first wireless transmitter across a first battery;

connecting a second wireless transmitter across a second battery;

programming the transmitters to modulate a semiconductor across the corresponding battery to draw a current within an order of magnitude of a normal battery leakage current;

encoding each of the transmitters to identify the corresponding battery;

transmitting, randomly, data from the transmitters regarding the corresponding battery to a receiver; and validating each data upon receipt, wherein—
   if the data fails validation the data is discarded, and
   if the data passes validation, the data is time stamped and stored in a database;

wherein the communications is one way, such that the receiver does not request data from the transmitters.

18. The method of claim 17, wherein each transmission requires less than one tenth of available bandwidth.

* * * * *